(12) United States Patent
Taniguchi et al.

(10) Patent No.: US 6,861,372 B2
(45) Date of Patent: Mar. 1, 2005

(54) SEMICONDUCTOR DEVICE MANUFACTURING METHOD

(75) Inventors: Toshimitsu Taniguchi, Gunma (JP); Shigeyuki Furuya, Niigata (JP)

(73) Assignee: Sanyo Electric Co., Ltd., Osaka (JP)

( * ) Notice: Subject to any disclaimer, the term of this patent is extended or adjusted under 35 U.S.C. 154(b) by 0 days.

(21) Appl. No.: 09/891,580

(22) Filed: Jun. 26, 2001

(65) Prior Publication Data

US 2002/0013067 A1 Jan. 31, 2002

(30) Foreign Application Priority Data

Jul. 21, 2000 (JP) .................................. P. 2000-220697
Mar. 16, 2001 (JP) .................................. P. 2001-076117

(51) Int. Cl.[7] .......................................... H01L 21/469
(52) U.S. Cl. ...................... 438/761; 438/787; 438/763; 438/276; 438/778
(58) Field of Search .............................. 438/761, 787, 438/763, 778, 791, 514, 258, 264, 981, 618, 642, 591, 648, 275, 585, 593, 287, 424, 276, 439

(56) References Cited

U.S. PATENT DOCUMENTS 5,254,489 A * 10/1993 Nakata .................... 438/258
5,502,009 A * 3/1996 Lin ......................... 438/275
6,380,020 B1 * 4/2002 Shimizu ................... 438/225
6,404,024 B1 * 6/2002 Ishigaki ................... 257/401

FOREIGN PATENT DOCUMENTS

| JP | 08130250 A | * 5/1996 | ....... H01L/21/8234 |
| JP | 7161820 | 6/1996 | |
| JP | 8130250 | 5/1999 | |

OTHER PUBLICATIONS

Korean Office Action dated May 27, 2003.

* cited by examiner

Primary Examiner—Matthew Smith
Assistant Examiner—Igwe U. Anya
(74) Attorney, Agent, or Firm—Fish & Richardson P.C.

(57) ABSTRACT

A substrate is provided having first and second formation areas. An oxide film is formed on both formation areas. An oxidation resistance film is then formed on the oxide film. The second formation area is masked by disposing a photoresist on the oxidation resistance film above the second formation area. The oxidation resistant film is removed from the first formation area and then the photoresist above the second formation area is removed. The oxide film above the first formation area is removed while using the oxidation resistant film above the second formation area as a mask. A first oxide film is formed on the first formation area followed by the removal of the oxidation resistance film above the second formation area. Subsequently, a second oxide film is formed on the second formation area. The first oxide film is designed to have thickness different from the second oxide film.

12 Claims, 18 Drawing Sheets

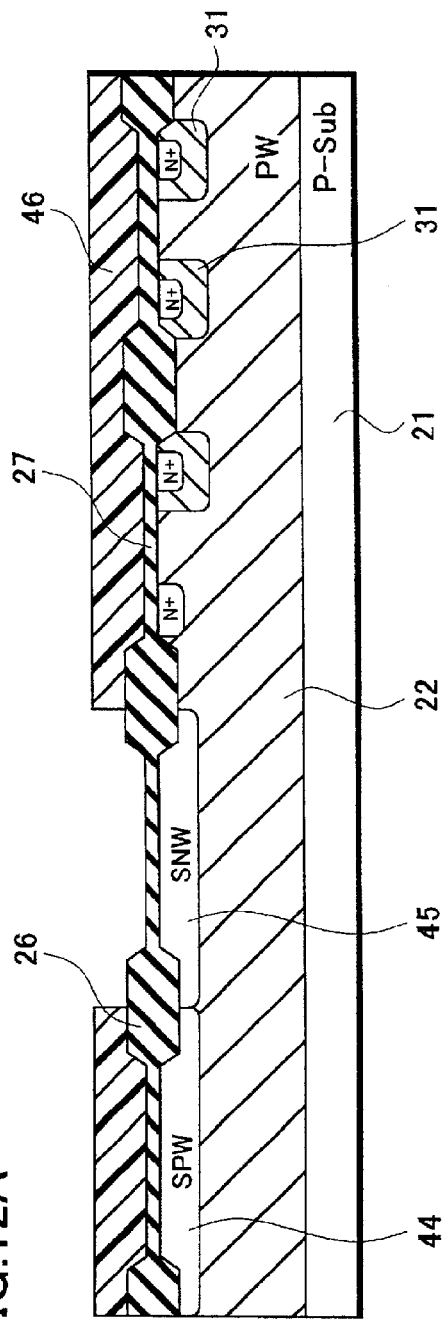

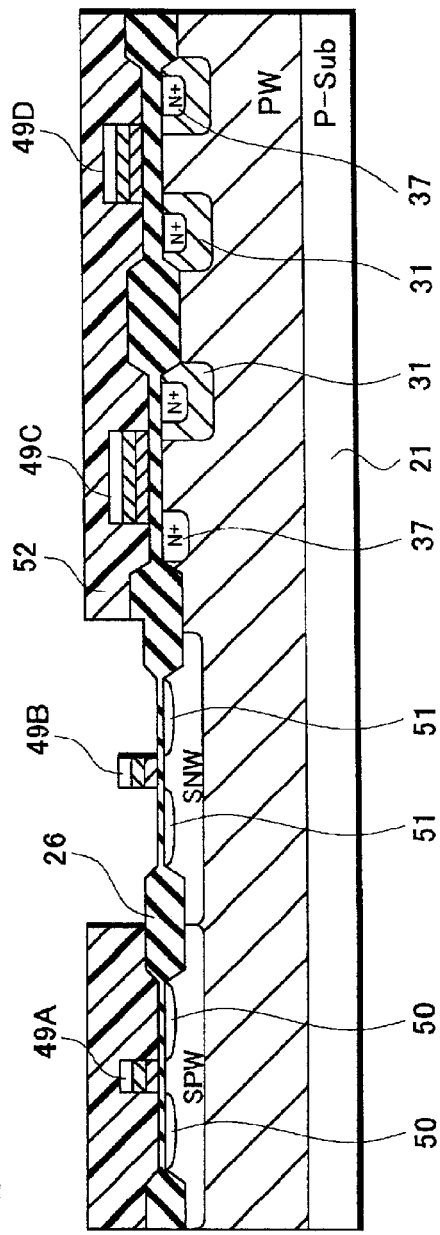
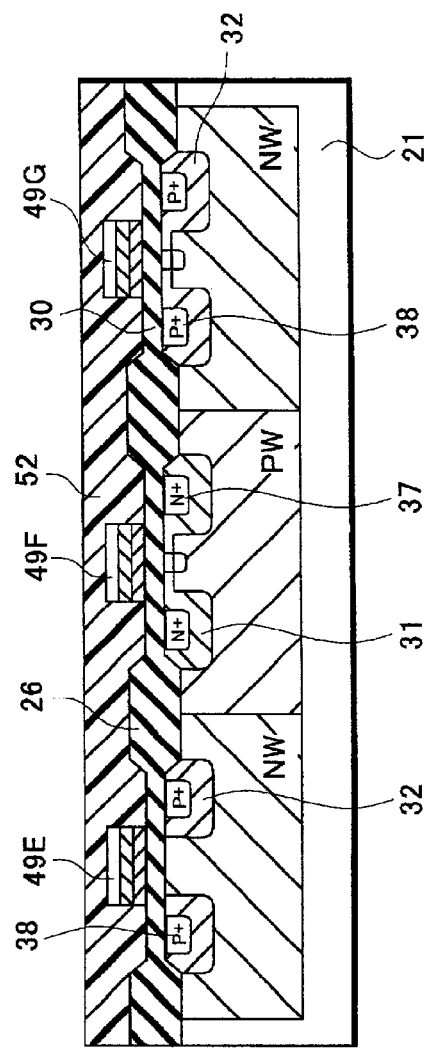
FIG.15A
FIG.15B

SEMICONDUCTOR DEVICE MANUFACTURING METHOD

BACKGROUND OF THE INVENTION

The present invention relates to a semiconductor device manufacturing method, and relates in particular to a method for manufacturing a semiconductor device having multiple types of gate oxide films having different thicknesses.

A conventional semiconductor device manufacturing method will now be described while referring to the drawings.

In the following explanation, a method is employed for manufacturing a semiconductor device wherein two oxide films having different thicknesses, i.e., a thick oxide film and a thin oxide film, are formed on a semiconductor substrate and a high-voltage MOS transistor is formed on the thick oxide film while a normal-voltage MOS transistor is formed on the thin oxide film.

First, according to the conventional LOCOS technique, an device separation film 102, which is a LOCOS film, is formed by oxidation, the area to avoid the oxidation is covered with an oxide film and a silicon nitride film that are formed on a conductive semiconductor substrate, i.e., a P-type silicon substrate 101 (see FIG. 17A).

Then, after the oxide film and the silicon nitride film are removed, as is shown in FIG. 17B, thermal oxidation is performed for the substrate 101 by using an device separation film 102 as a mask, and a thick gate oxide film 103 is formed thereon.

Next, as is shown in FIG. 17C, a photoresist film 104 is formed on a portion of the thick gate oxide film 103 (on the high-voltage MOS transistor formation area), and the other portion of the thick gate oxide film 103 (on the normal-voltage MOS transistor formation area) is removed by using as a mask the photoresist film 104.

Further, after the photoresist film 104 is removed, a thin gate oxide film 105 is formed by thermal oxidation, as is shown in FIG. 18A, on the normal-voltage MOS transistor formation area where the thick gate oxide film 103 is removed.

As is shown in FIG. 18B, a conductive film for a gate electrode is formed on the thick gate oxide film 103 and the thin gate oxide film 105, and is patterned to form gate electrodes 106A and 106B.

Furthermore, N-type impurity areas (source/drain areas 107, 108, 109 and 110) are formed adjacent to the gate electrodes 106A and 106B, and an interlayer insulating film (not shown) is formed to cover these areas. Then, a metal wire (not shown) is formed to contact the source/drain areas 107, 108, 109 and 110, via contact holes (not shown), so that a high-voltage MOS transistor is formed on the thick gate oxide film 103, while a normal-voltage MOS transistor is formed on the thin gate oxide film 105.

However, during this process, since in addition to the thick gate oxide film 103 the device separation film 102 is etched (see an arrow C in FIG. 17C), the device separation film 102 is thinned and the device separation is reduced.

Further, since the photoresist film 104 is used as a mask while the thick gate oxide film 103 is etched, the silicon substrate 101 is contaminated with organic material which is contained in the photoresist film 104. Thus, when the thin gate oxide film 105 is formed by thermal oxidation on the contaminated silicon substrate 101, deterioration of the quality of the thin gate oxide film 105 occurs.

SUMMARY OF THE INVENTION

To resolve this problem, according to a first aspect of the present invention, a semiconductor device manufacturing method for forming on a semiconductor first and second gate oxide films having different thicknesses comprises the steps of:

forming a resistant oxide film on a second gate oxide film formation area, and performing thermal oxidization by using the resistant oxide film as a mask while forming a first gate oxide film on a first gate oxide film formation area; and removing the resistent oxide film and performing thermal oxidization to form a second gate oxide film on the second gate oxide film formation area.

According to a second aspect of the present invention, a semiconductor device manufacturing method comprises the steps of:

performing thermal oxidation by using, as a mask, an device separation film formed on a semiconductor, and forming an oxide film on a first and a second transistor formation area;

forming a resistant oxide film across the entire surface of the first and the second transistor formation areas, and using a photoresist film as a mask to remove the resistant oxide film from the first transistor formation area;

using the resistant oxide film as a mask to perform thermal oxidization, after removing the oxide film from the first transistor formation area by using the resistant oxide film as a mask, and forming a first gate oxide film on the first transistor formation area; and removing the resistant oxide film and the oxide film on the second transistor formation area, and using thermal oxidization to form a second gate oxide film on the second transistor formation area.

A high-voltage MOS transistor is formed on the first gate oxide film, which is thicker than the second gate oxide film, while a normal-voltage MOS transistor is formed on the second gate oxide film.

At the step whereat the photoresist film is used as a mask and the resistant oxide film is removed from the first transistor formation area, the surface layer of the semiconductor is not exposed.

The step of forming a first transistor includes the steps of:

forming an opposite conductive source/drain layer having a low concentration by the ion implantation of an opposite conductive impurity into a semiconductor of one conductive type;

forming an opposite conductive source/drain layer having a high concentration in the opposite conductive source/drain layer having the low concentration by the ion implantation of an opposite conductive impurity into the semiconductor;

forming a semiconductor layer of one conductive type that serves as a channel, which is located between the opposite conductive source/drain layers; and forming a first gate electrode on the semiconductor via the first gate oxide film.

The opposite conductive source/drain layer having a low concentration is so formed that it, at the least, contacts the semiconductor layer that is formed below the gate electrode using an ion implantation method.

Further, the opposite conductive source/drain layer having a low concentration is formed and extended at a small depth in the surface layer of the semiconductor layer, so that, at the least, the opposite conductive source/drain layer contacts the semiconductor layer that is formed below the gate electrode using an ion implantation method.

Therefore, since the conventional step of etching and removing the thick gate oxide film is not required, the deterioration of the device separation due to the reduction in the thickness of the device separation film can be suppressed.

Further, since the silicon substrate is not exposed during the process performed for etching the photoresist film, contamination into the silicon substrate due to the organic material of the photoresist film can be prevented.

BRIEF DESCRIPTION OF THE DRAWINGS

FIGS. 12A and 12B are cross-sectional views of the semiconductor device manufacturing method according to the second embodiment of the invention;

FIGS. 15A and 15B are cross-sectional views of the semiconductor device manufacturing method according to the second embodiment of the invention;

DETAILED DESCRIPTION OF THE PREFERRED EMBODIMENT (Embodiment 1)

A method for manufacturing a semiconductor device in accordance with a first embodiment of the present invention will now be described while referring to the accompanying drawings.

In the following explanation, a manufacturing method is employed for a semiconductor device wherein two oxide films having different thicknesses, i.e., a first oxide film (thick gate oxide film) and a second oxide film (thin gate oxide film), are formed on a silicon substrate, and a high-voltage MOS transistor is formed on the thick gate oxide film while a normal-voltage MOS transistor is formed on the thin gate oxide film.

Figure 1A:
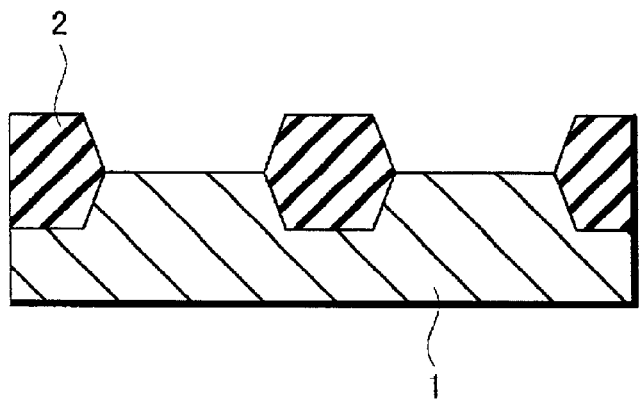
FIGS. 1A to 1C are cross-sectional views of a semiconductor device manufacturing method according to a first embodiment of the invention.

First, an oxide film and a silicon nitride film are formed on a silicon substrate 1 and used as a mask in a well known LOCOS technique, then, an device separation film 2, a LOCOS film about 450 nm thick, is formed (see FIG. 1A). In this embodiment, a P-type silicon substrate 1 is employed; however, the same explanation can also be employed for an N-type silicon substrate for which only the conductive type is different.

Figure 1B:
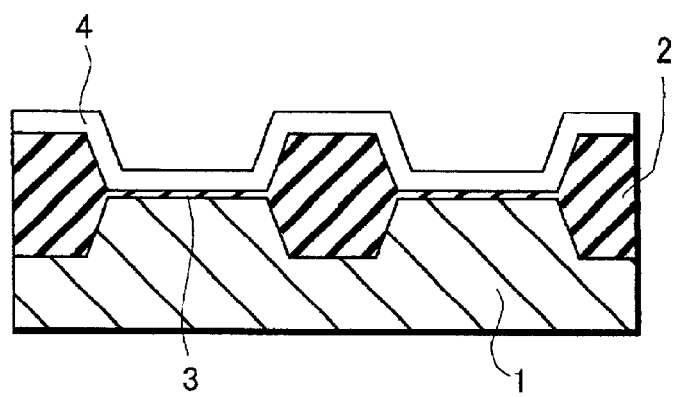

After the oxide film and the silicon nitride film are removed, as is shown in FIG. 1B, an oxide film 3 having a thickness of about 20 nm is formed on the substrate 1 by thermal oxidization, while the device separation film 2 is used as a mask. Thereafter, a silicon nitride film 4 having a thickness of about 20 nm is formed across the entire substrate, to include both the device separation film 2 and the oxide film 3.

Figure 1C:
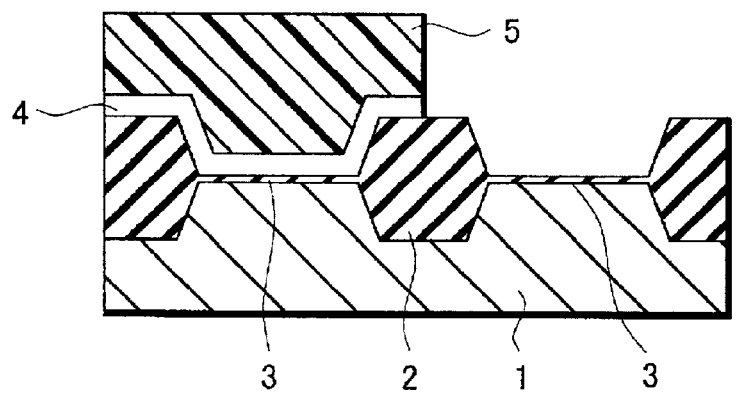

Following this, as is shown in FIG. 1C, a photoresist film 5 is formed on one portion (the normal-voltage transistor formation area) of the oxide film 3 and the silicon nitride film 4, and while using the photoresist mask 5 as a mask, the silicon nitride film 4 is removed from the other portion of the oxide film 3 (the high-voltage MOS transistor formation area).

Since the surface of the substrate is not exposed at the etching step during which the photoresist film 5 is used, the surface of the substrate is not contaminated by the organic material contained in the photoresist layer 5. To expose the surface of the substrate, as will be described at the next step, the photo resist film 5 is removed and then the silicon nitride film 4 is used as a mask.

Figure 2A:
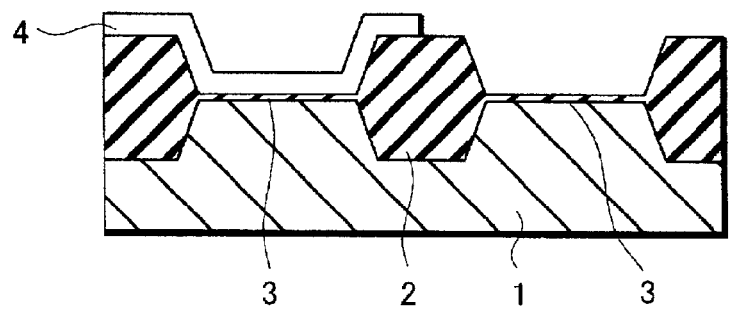
FIGS. 2A to 2C are cross-sectional views of the semiconductor device manufacturing method according to the first embodiment of the invention.
Figure 2B:
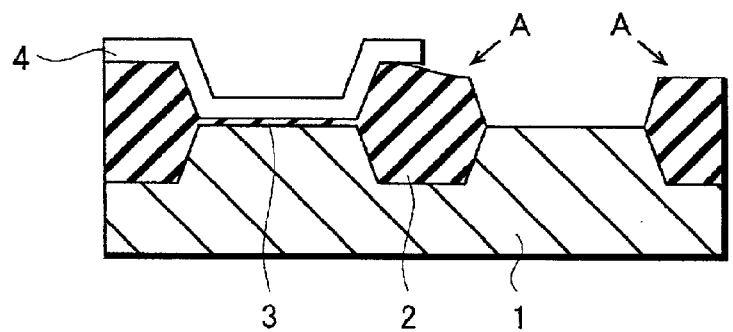

As is shown in FIG. 2A, the photoresist film 5 is removed, and as is shown in FIG. 2B, the other oxide film 3 is removed while the silicon nitride film 4 is used as a mask. At this time, while the oxide film 3 is being removed, etching of the device separation film 2 occurs; but since, as is mentioned above, the oxide film 3 is about 20 nm thick, compared with the conventional case wherein the etching and the removal of a portion of the thick gate oxide film 103 (e.g., 100 nm) occurs, there is no deterioration of the device separation (see the two arrows A in FIG. 2B).

Figure 2C:
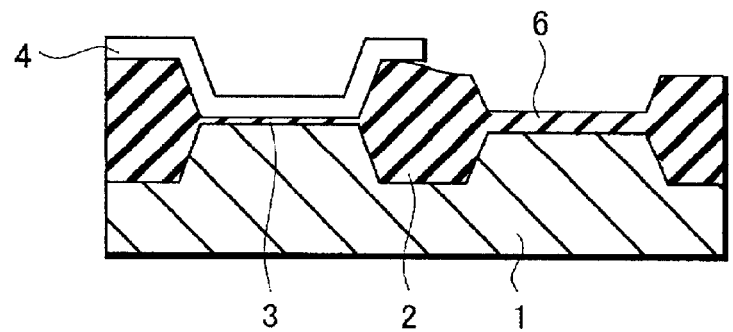

Following this, while using the silicon nitride 4 as a mask, as is shown in FIG. 2C, thermal oxidation is employed to form on the substrate 1 a first oxide film (thick gate oxide film) 6 having a thickness of about 90 nm.

Figure 3A:
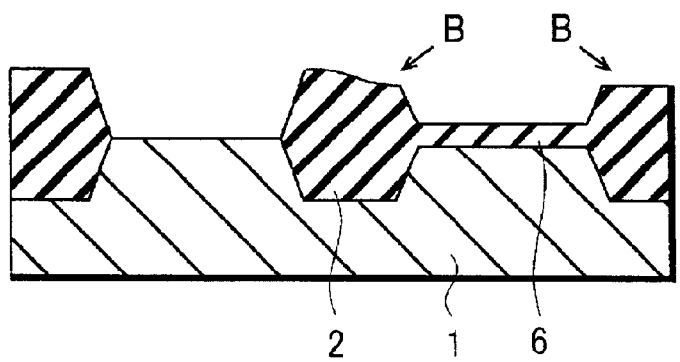
FIGS. 3A to 3C are cross-sectional views of the semiconductor device manufacturing method according to the first embodiment of the invention.
Figure 3B:
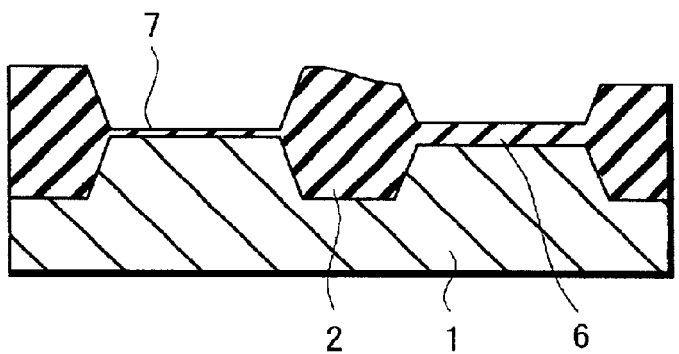

Subsequently, as is shown in FIG. 3A, the silicon nitride film 4 and the oxide film 3 are removed from the normal-voltage MOS transistor formation area, and as is shown in FIG. 3B, thermal oxidation of the substrate 1 is employed to form a second oxide film (thin gate oxide film) 7 having a thickness of about 7 nm on the normal-voltage MOS transistor formation area. At this time, while the oxide film 3 is being removed, etching of the device separation film 2 again occurs; but since the oxide film 3 is about 20 nm thick, the total thickness to be etched and removed is about 40 nm, and therefore, compared with the conventional case wherein the etching and the removal of a portion of the thick gate oxide film 103 (e.g., 100 nm) occurs, there is no deterioration of the element separation function (see the arrows B in FIG. 3A).

Figure 3C:
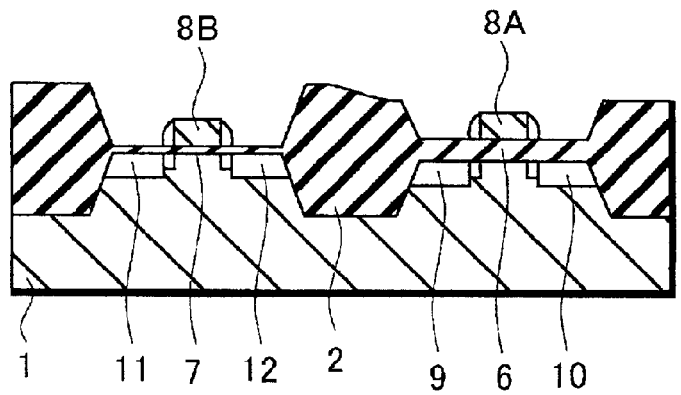

Thereafter, as is shown in FIG. 3C, conductive film for a gate electrode (e.g., a polysilicon film, or a lamination having a polysilicon film and a tungsten silicide ($WSi_x$) film) is formed on the thick gate oxide film 6 and on the thin gate oxide film 7, and is patterned to form gate electrodes 8A and 8B.

Then, adjacent to the gate electrodes 8A and 8B, N-type impurity areas (source/drain areas 9, 10, 11 and 12) are formed and an interlayer insulating film (not shown) is formed to cover them. After that, metal wires are formed to contact the source/drain areas 9, 10, 11 and 12 via contact holes, while the high-voltage MOS transistor is formed on the thick gate oxide film 6 and the normal-voltage MOS transistor is formed on the thin gate oxide film 7. In this embodiment, phosphorus ions and arsenic ions are injected as N-impurities, and a source/drain structure is formed that has a so-called LDD structure.

Thus, the conventional etching step of removing the thick gate oxide film is not required, and the deterioration of the element separation function due to the reduction in the thickness of the device separation film can be suppressed.

Further, since the silicon substrate is not exposed during the etching process for which the photoresist film is used, the silicon substrate is not contaminated with the organic material contained in the photoresist film, so that a high quality can be maintained for a gate oxide film that is formed later.

(Embodiment 2)

A semiconductor device manufacturing method in accordance with a second embodiment of the present invention will now be described. In the second embodiment, a method is employed for manufacturing various MOS transistors that constitute a driver for a display device, e.g., an EL display device.

Figure 16A:
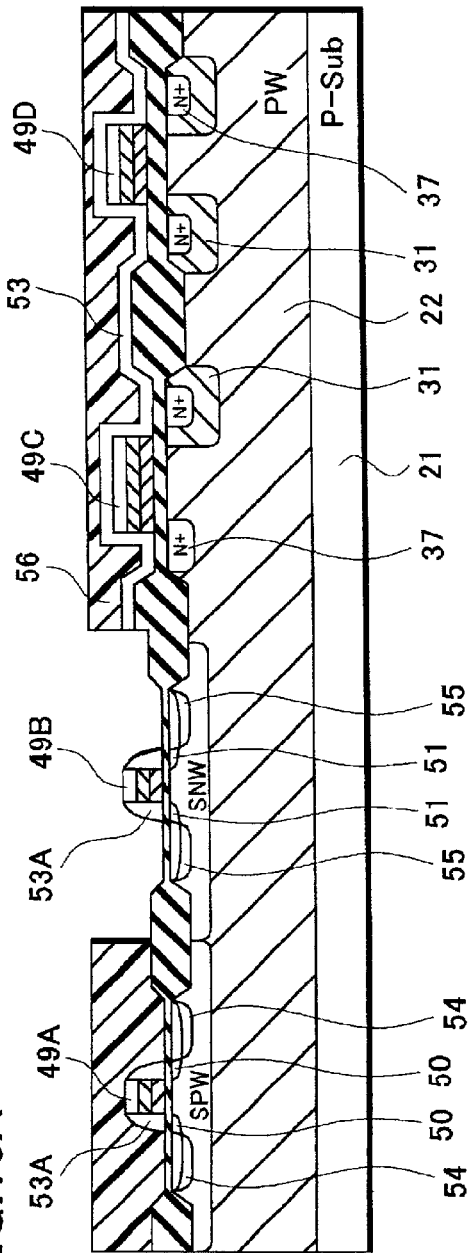
FIGS. 16A and 16B are cross-sectional views of the semiconductor device manufacturing method according to the second embodiment of the invention.

A semiconductor device according to the present invention, i.e., an EL display driver, comprises, beginning at the left in FIG. 16A, an N-channel MOS transistor, a P-channel MOS transistor of a logic type (e.g., 3 V) and an N-channel MOS transistor for a level shifter (e.g., 30 V), and an N-channel MOS transistor of a high-voltage type (e.g., 30 V), and by, beginning at the left in 16B, a P-channel MOS transistor of a high-voltage type (e.g., 30 V), an N-channel MOS transistor and a P-channel MOS transistor of a high-voltage type (e.g., 30 V) and of a low on-resistance.

For the convenience during the explanation, the high-voltage MOS transistor of low on-resistance is called an SLED (Slit channel by counter doping with extended shallow drain) MOS transistor, so that the high-voltage MOS transistor is distinguished from the high-voltage MOS transistor of low on-resistance.

An explanation will now be given for a method used to manufacture the various MOS transistors that constitute the EL display driver.

Figure 4A:
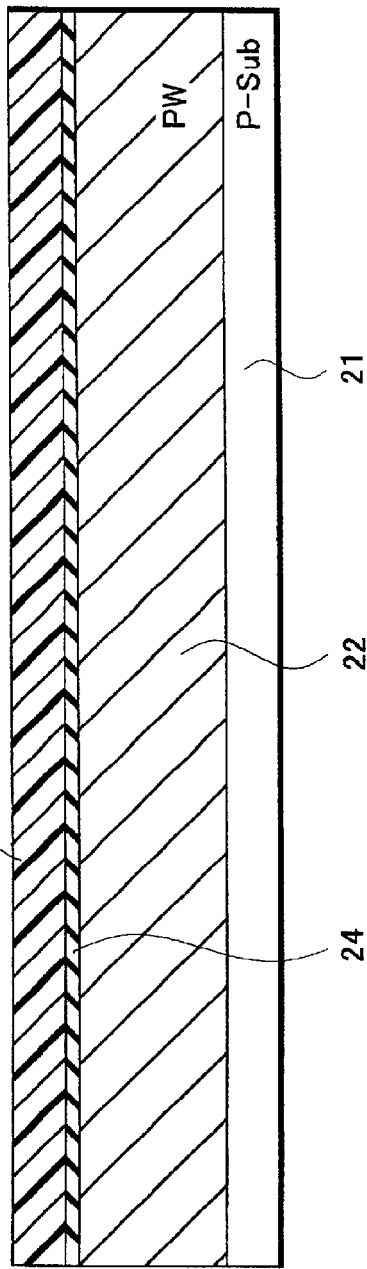
FIGS. 4A and 4B are cross-sectional views of a semiconductor device manufacturing method according to a second embodiment of the invention.
Figure 4B:
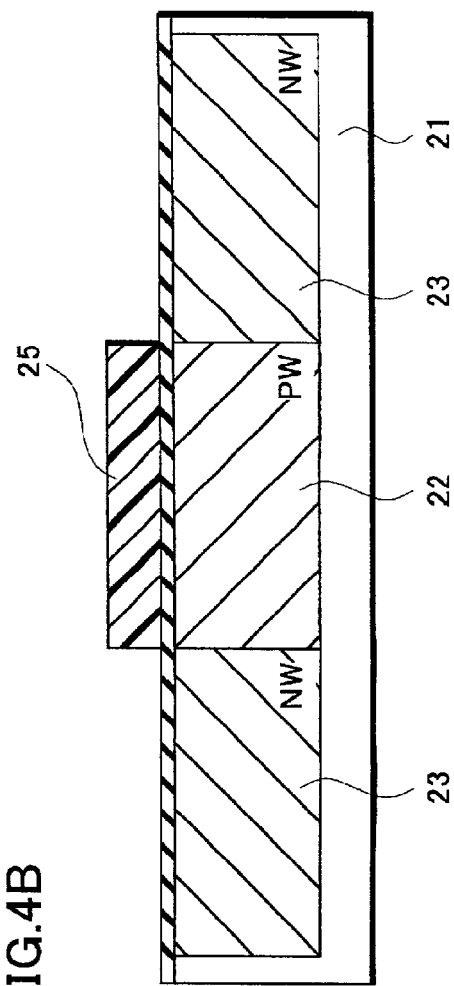

First, in FIGS. 4A and 4B, P-type wells (PWs) 22 and N-type wells (NWs) 23 are formed on a semiconductor substrate of one conductive type, e.g., a P-type silicon substrate (P-Sub) 21, in order to define areas for constituting various types of MOS transistors.

Specifically, the N-type well formation area on the substrate 21 is covered with a photoresist film (not shown) via a pad oxide film 24, and boron ions, for example, are implanted under a condition at acceleration energy of about 80 keV and at a dose of $8 \times 10^{12}/cm^2$. Thereafter, as is shown in FIGS. 4A and 4B, the P-type well 22 is covered with a photoresist film 25, and phosphorus ions, for example, are implanted under a condition at acceleration energy of about 80 keV and a dose of $9 \times 10^2/cm^2$. Actually, as is described above, these injected ions are thermally diffused (e.g., four hours in an $N_2$ ambience at a temperature of 1150° C.), and the P-type well 22 and the N-type wells 23 are formed.

Figure 5A:
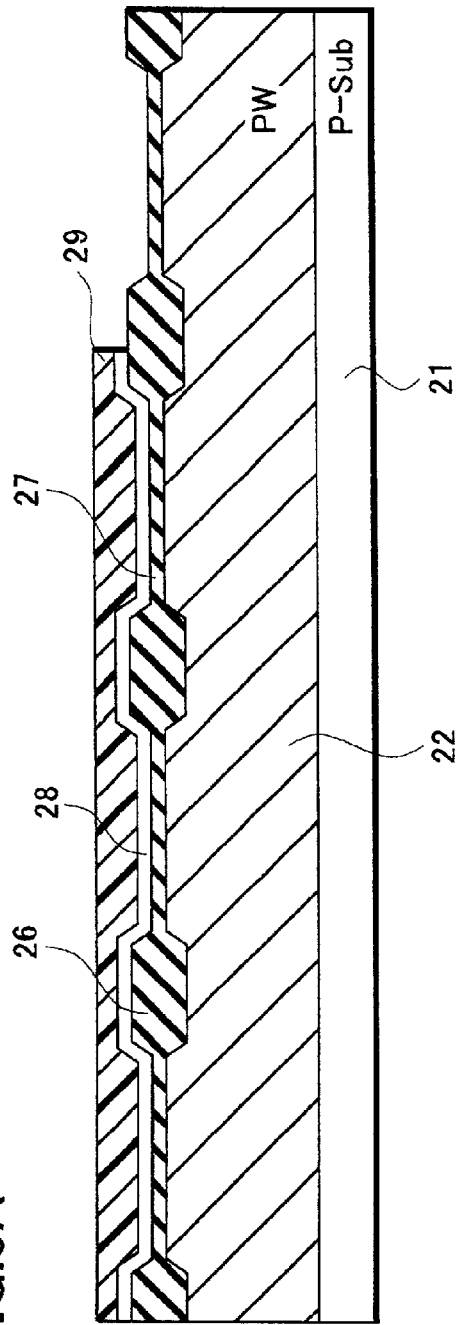
FIGS. 5A and 5B are cross-sectional views of the semiconductor device manufacturing method according to the second embodiment of the invention.
Figure 5B:
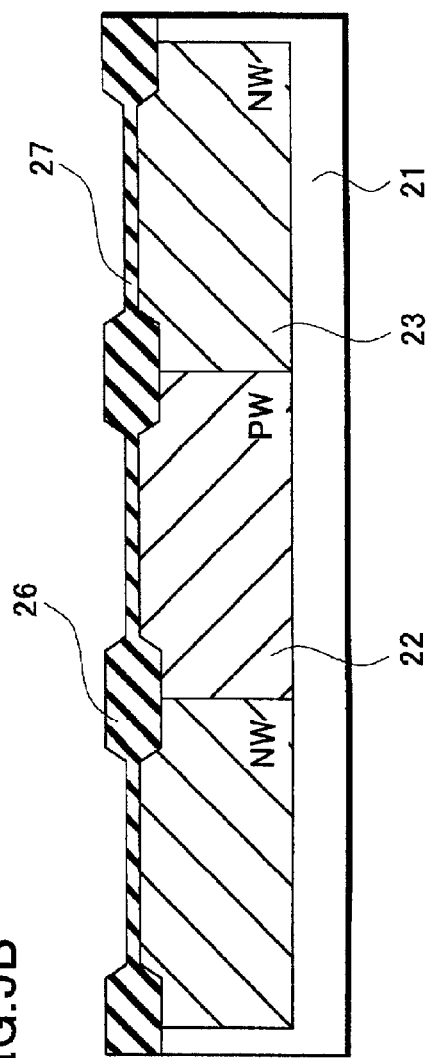

In FIGS. 5A and 5B, in order to separate the MOS transistors, device separation films 26 about 500 nm thick are formed using the LOCOS method, and a third oxide film 27 (a third gate oxide film) about 20 nm thick is formed by thermal oxidization on active areas other than the device separation film 26.

Following this, a silicon nitride film 28 about 20 nm thick is formed across all the areas, and is patterned by using a photoresist film 29 as a mask, so that the film 28 is not removed from the areas used for forming an N-channel MOS transistor and a P-channel MOS transistor of the logic type, and an N-channel MOS transistor for a level shifter.

Since the surface layer of the substrate is not exposed at the etching step for the photoresist film 29, the surface layer is not contaminated with the organic material contained in the photoresist film 29. Then, to expose the surface layer of the substrate, as will be described at the next step, the silicon nitride film 28 that remains following the removal of the photoresist film 29 is used as a mask.

Subsequently, after the photoresist film 29 is removed the silicon nitride film 28 is used as a mask to remove a third gate oxide film 27 covering the areas for forming an N-channel MOS transistor and a P-channel MOS transistor of high-voltage type, and an N-channel SLEDMOS transistor and a P-channel SLEDMOS transistor.

At this time, as the third oxide film 27 is removed, the device separation film 26 is also etched and removed; but as is described above, since the thickness of the third oxide film 27 is approximately 20 nm, compared with the conventional case wherein the thick gate oxide film 103 (e.g., 100 nm) is removed by etching, there is no deterioration of the element separation.

Figure 6A:
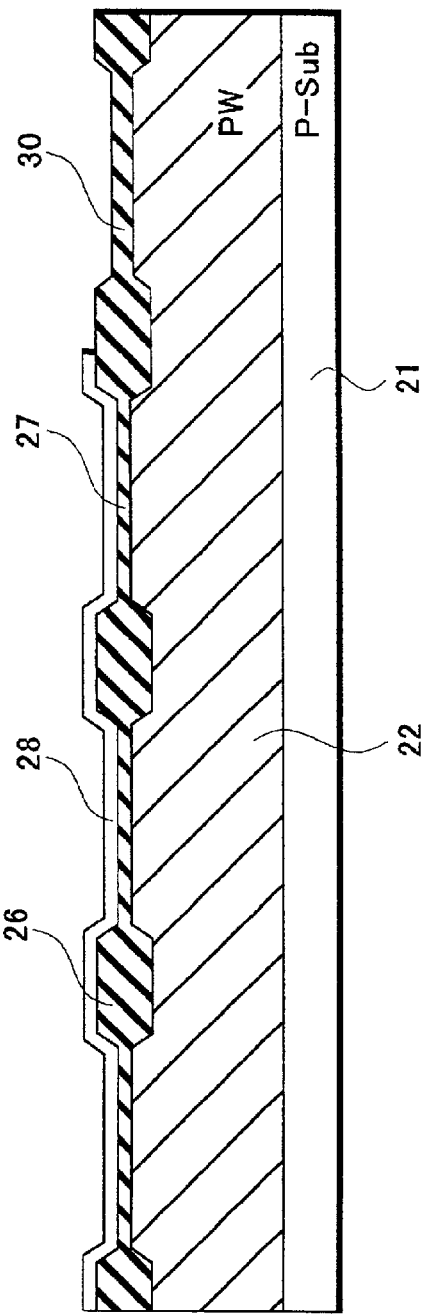
FIGS. 6A and 6B are cross-sectional views of the semiconductor device manufacturing method according to the second embodiment of the invention.
Figure 6B:
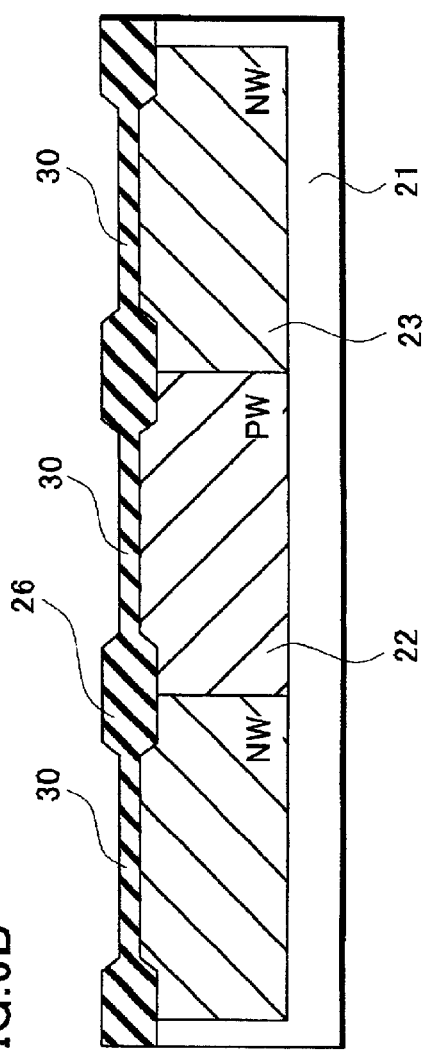

Then, using the silicon nitride film 28 as a mask, a thick first oxide film 30 (a first gate oxide film) about 80 nm thick, for high voltage, is formed by thermal oxidation on the areas for forming the N-channel MOS transistor and the P-channel MOS transistor of the high-voltage type, and the N-channel SLEDMOS transistor and the P-channel SLEDMOS transistor (see FIGS. 6A and 6B).

Figure 7A:
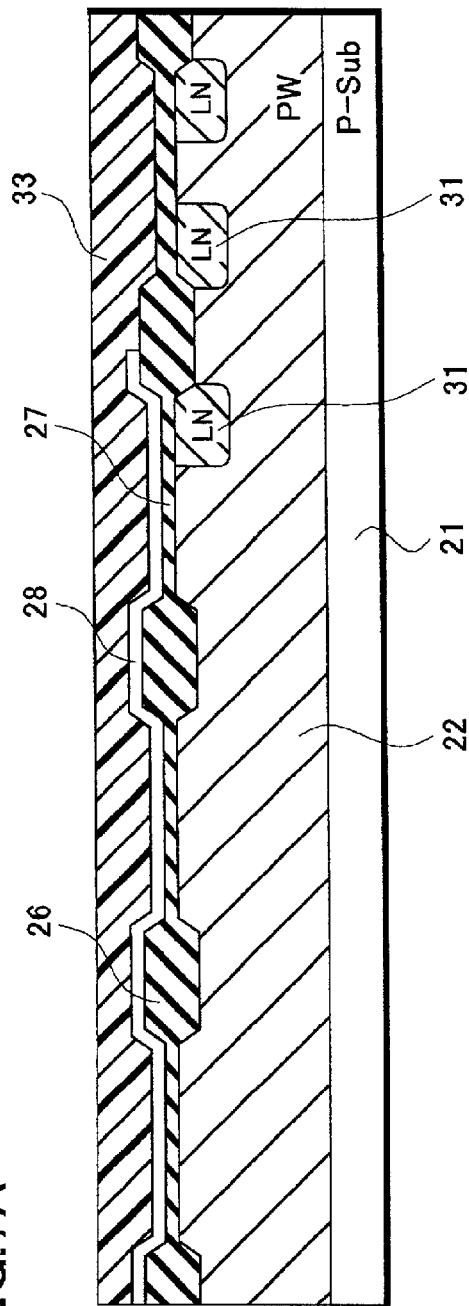
FIGS. 7A and 7B are cross-sectional views of the semiconductor device manufacturing method according to the second embodiment of the invention.
Figure 7B:
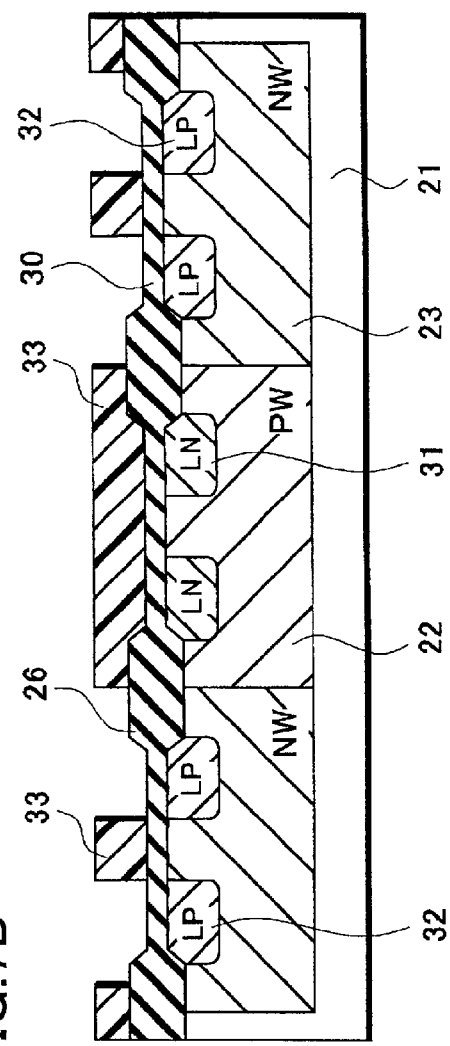

Following this, in FIGS. 7A and 7B, first N-type and P-type source/drain layers having a low concentration (hereinafter referred to as an LN layer 31 and an LP layer 32) are formed by using a photoresist film as a mask. That is, areas except the LN layer formation area are covered with a photoresist layer (not shown), and phosphorus ions, for example, are implanted into the surface layer of the substrate under a condition at acceleration energy of about 120 keV and at a dose of $8 \times 10^{12}/cm^2$ to form the LN layers 31. Thereafter, areas except the LP layer 31 formation areas are covered with a photoresist film 33, and boron ions, for example, are implanted into the surface layer of the substrate under a condition at acceleration energy of about 120 keV and at a dose of $8.5 \times 10^{12}/cm^2$ to form the LP layers 32. Actually, following the annealing step, which is the post-process (e.g., two hours in an $N_2$ ambience at a temperature of 1100° C.), the above described injected ions are thermally diffused to form the LN layers 31 and the LP layers 32.

Figure 8A:
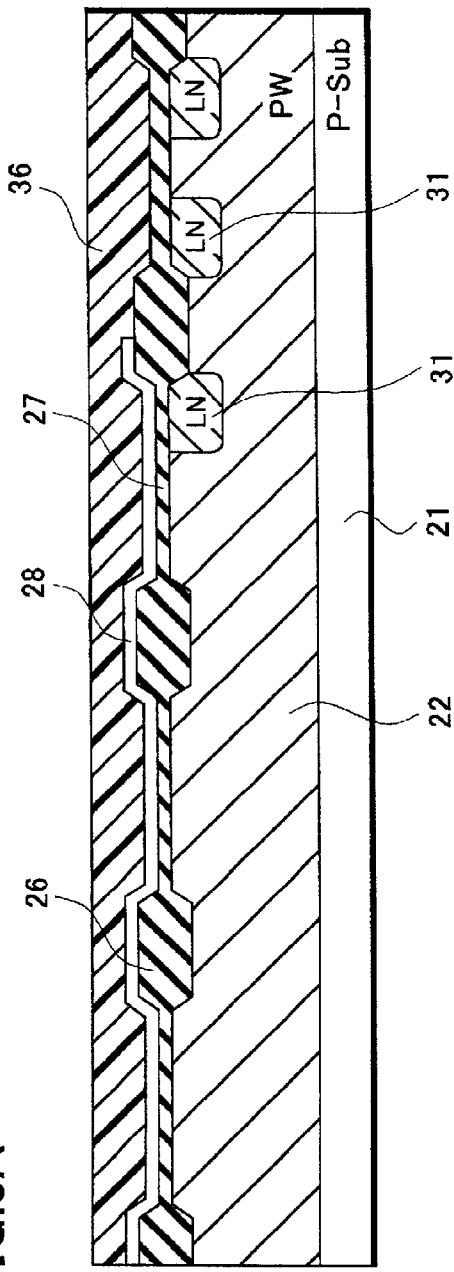
FIGS. 8A and 8B are cross-sectional views of the semiconductor device manufacturing method according to the second embodiment of the invention.
Figure 8B:
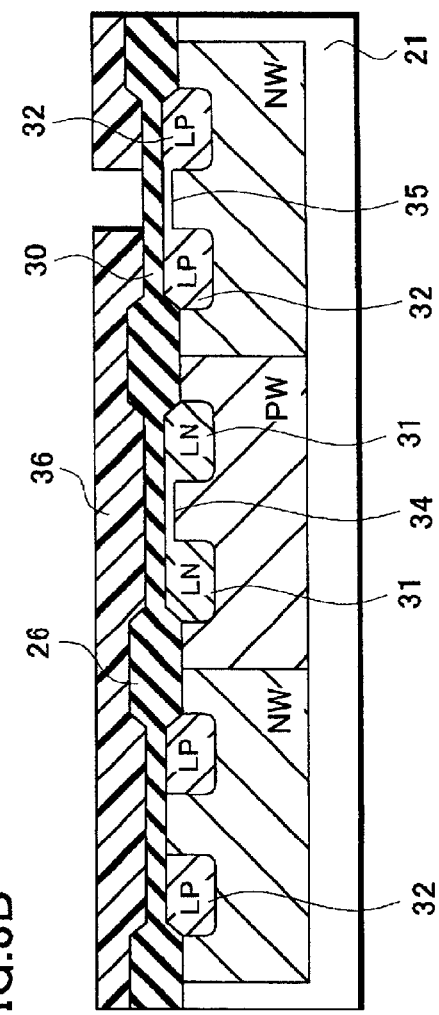

Next, in FIGS. 8A and 8B, by using a photoresist film as a mask, second N-type and P-type source/drain layers having a low concentration (hereafter referred to as an SLN layer 34 and an SLP layer 35) are formed between the LN layers 31 and the LP layers 32 in those areas wherein the P-channel and N-channel SLEDMOS transistors are formed. That is, first, areas except the SLN layer formation areas are covered with a photoresist film (not shown), and phosphorus ions, for example, are implanted into the surface layer of the substrate under a condition at acceleration energy of about 120 keV and a dose of $1.5\times10^{12}/cm^2$ to form an SLN layer 34 continuous with the LN layer 31. Thereafter, the areas except the SLP layer formation areas are covered with a photoresist layer 36, and boron difluoride ions, for example, are implanted under a condition at acceleration energy of about 140 keV and a dose of $2\times10^{15}/cm^2$ to form the SLP layer 35 continuous with the LP layer 32. The impurity concentration of LN layer 31 and the SLN layer 34 or the LP layer 32 and the SLP layer 35 are same, or that of one or the other of the layers is high.

Figure 9A:
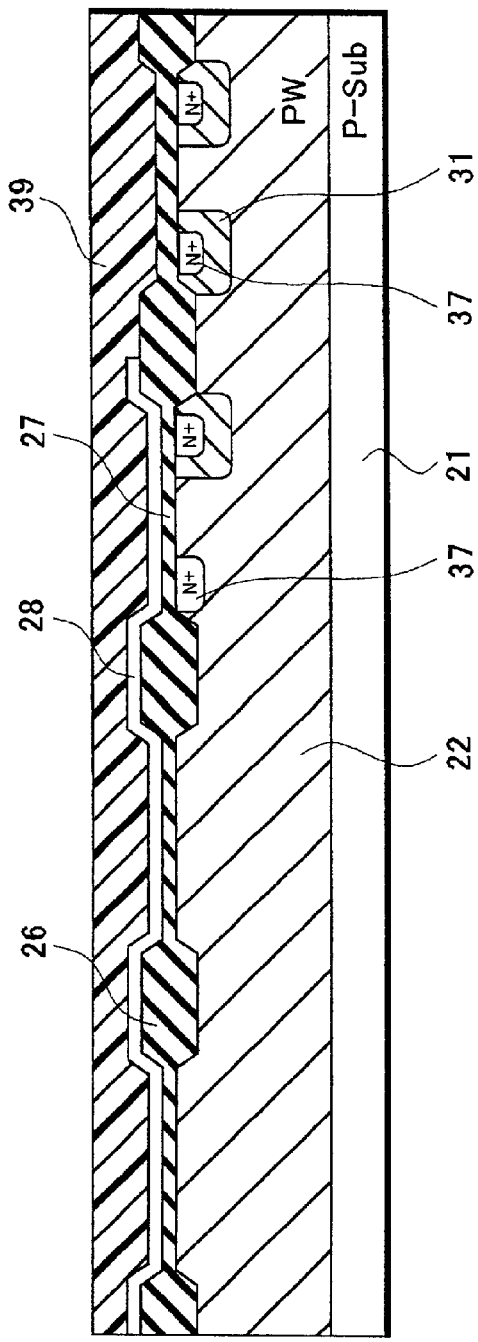
FIGS. 9A and 9B are cross-sectional views of the semiconductor device manufacturing method according to the second embodiment of the invention.
Figure 9B:
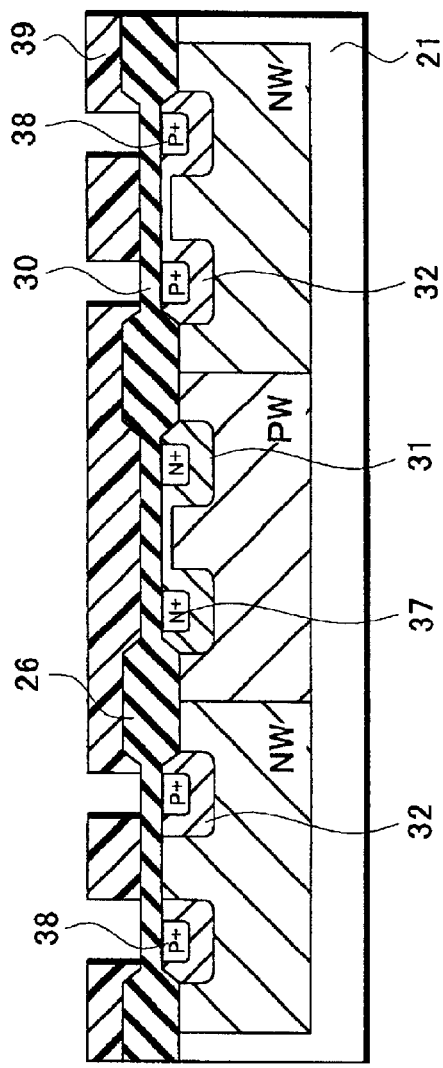

Further, in FIGS. 9A and 9B, by using a photoresist film as a mask, source/drain layers having a high concentration (hereafter referred to as an $N^+$ layer 37 and a $P^+$ layer 38) are formed. That is, first, areas except the $N^+$ layer formation areas are covered with a photoresist film (not shown), and phosphorus ions, for example, are implated into the surface layer of the substrate under a condition at acceleration energy of about 80 keV and a dose of $2\times10^{15}/cm^2$ to form an $N^+$ layer 37. Thereafter, the areas except the $P^+$ layer formation areas are covered with a photoresist layer 39, and boron difluoride ions, for example, are injected under an condition at acceleration energy of about 140 keV and a dose of $2\times10^{15}/cm^2$ to form the $P^+$ layer 38.

Figure 10A:
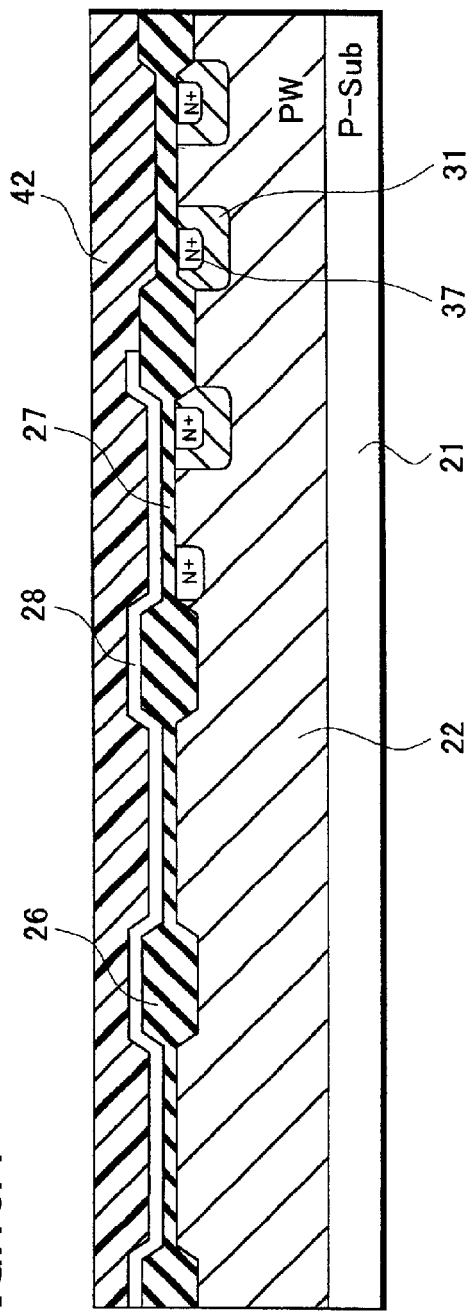
FIGS. 10A and 10B are cross-sectional views of the semiconductor device manufacturing method according to the second embodiment of the invention.
Figure 10B:
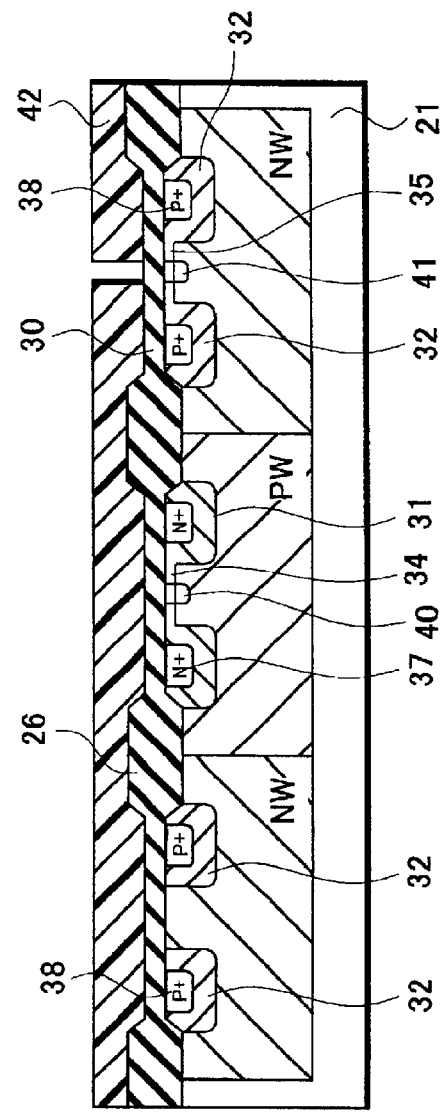

Next, in FIGS. 10A and 10B, by using as a mask a photoresist film that has a smaller opening width than the width (see FIGS. 8A and 8B) of the mask opening used for the formation of the SLN layer 34 and the SLP layer 35, an impurity of an opposite conductive type is injected into the center of the SLN layer 34 which is contiguous with the LN layer 31, and the center of the SLP layer 35 which is contiguous with the LP layer 32. Thus, a P-type body layer 40 and an N-type body layer 41 are formed to divide the SLN layer 34 and the SLP layer 35. That is, first, the areas except the P-type layer formation areas are covered with a photoresist film (not shown), and difluoride boron ions, for example, are implanted under a condition at acceleration energy of about 120 keV and at a dose of $5\times10^{12}/cm^2$. As a result, a P-body layer 40 is formed. Thereafter, the areas except the N-type layer formation areas are covered with a photoresist film 42, and phosphorus ions, for example, are implanted into the surface layer of the substrate under a condition at acceleration energy of about 190 keV and a dose of $5\times10^{12}/cm^2$ to form an N-body layer 41. The order of the ion implanting steps shown in FIGS. 8 to 10 can be changed as needed, and channels can be formed on the surfaces of the P-type body layer 40 and the N-type body layer 41.

Figure 11A:
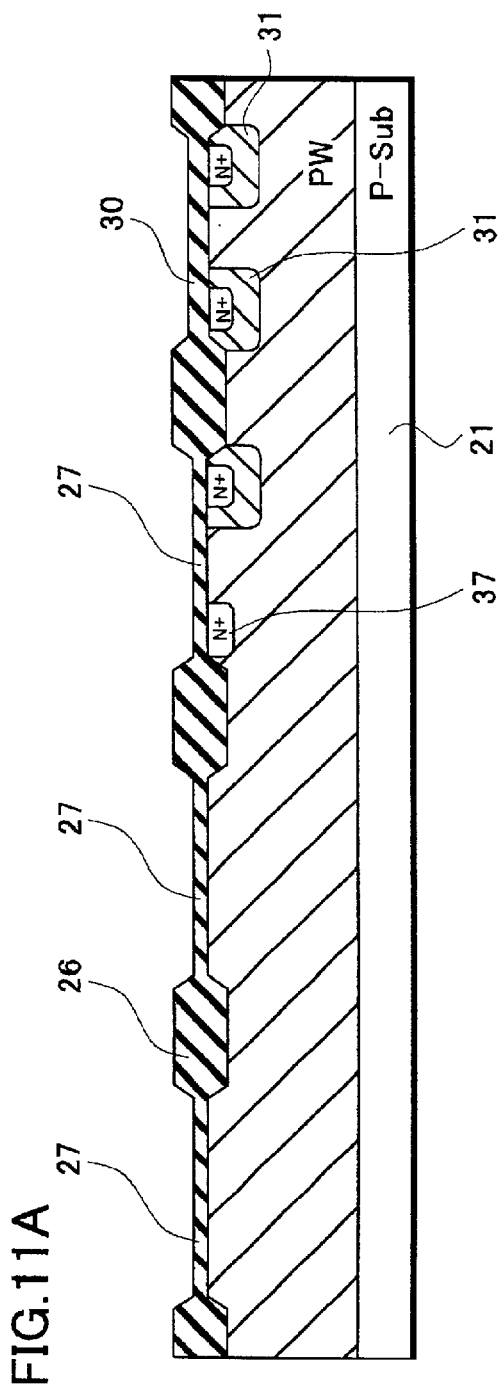
FIGS. 11A and 11B are cross-sectional views of the semiconductor device manufacturing method according to the second embodiment of the invention.
Figure 11B:
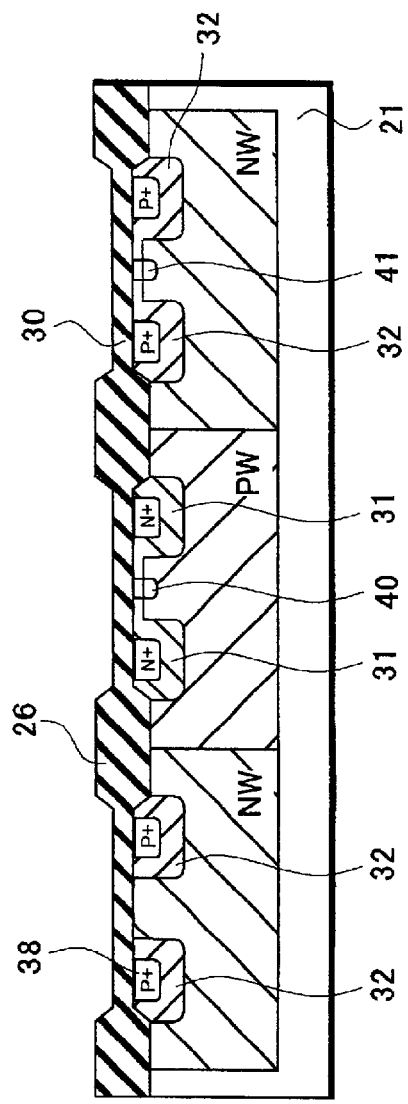

Next, in FIGS. 11A to 11B, the photoresist film 42 and the silicon nitride film 28 are removed.

Thereafter, as shown in FIGS. 12A and 12B, a second P-type well (SPW) 44 and a second N-type well (SNW) 45 are formed on the substrate (P-type well 22) in the areas for forming normal-voltage N-channel and P-channel MOS transistors having microstructures.

That is, by using as a mask a photoresist film having an opening in the area for forming a normal-voltage N-channel MOS transistor, boron ions, for example, are implanted into the P-type well 22 under a first condition at acceleration energy of about 190 keV and at a dose of $1.5\times10^{13}/cm^2$. Then, boron ions are implanted under a second condition at acceleration energy of about 50 keV and at a dose of $2.6\times10^{12}/cm^2$ and the second P-type well 44 is formed. Furthermore, by using as a mask a photoresist film 46 having an opening in the area for forming a normal-voltage P-channel MOS transistor, phosphorus ions, for example, are implanted under a condition at acceleration energy of about 380 keV and a dose of $1.5\times10^{13}/cm^2$, and the second N-type well 45 is formed. When high acceleration energy implanter of about 380 keV is not available, a double charge method may be employed whereby divalent phosphorus ions are implanted under a condition at acceleration energy of about 190 keV and at a dose of $1.5\times10^{13}/cm^2$. Thereafter, phosphorus ions are implanted under a condition at acceleration energy of about 140 keV and a dose of $4.0\times10^{12}/cm^2$.

Figure 13A:
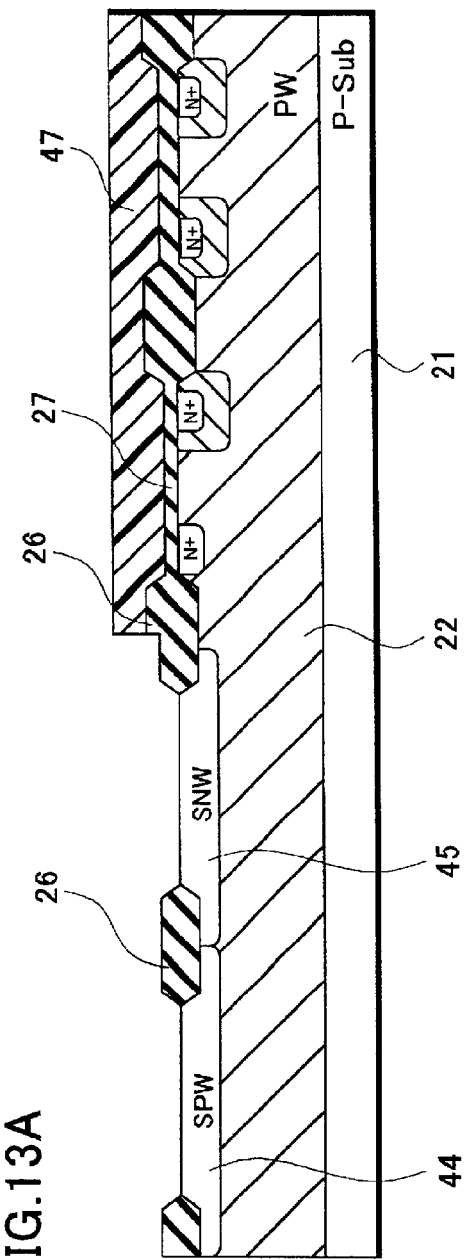
FIGS. 13A and 13B are cross-sectional views of the semiconductor device manufacturing method according to the second embodiment of the invention.
Figure 13B:
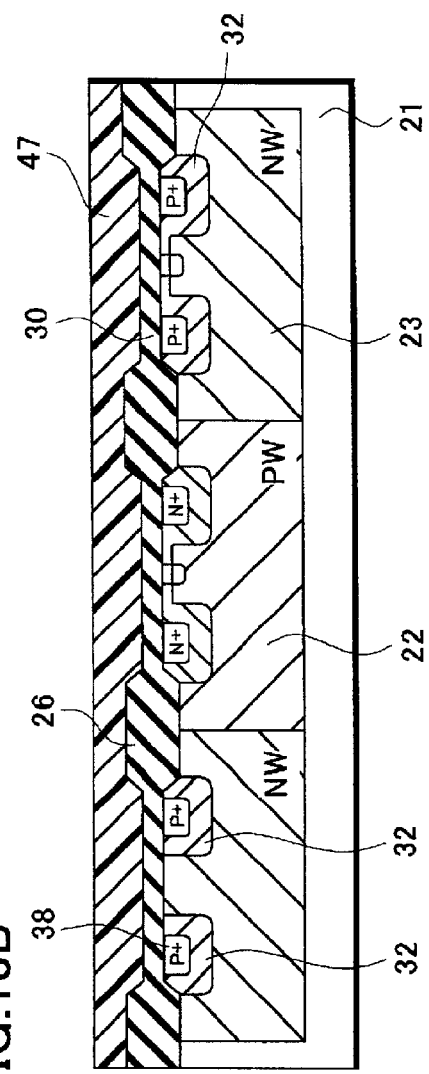

In FIGS. 13A and 13B, by using a photoresist film 47 as a mask, the third oxide film 27 is removed from the area for forming the normal-voltage N-channel and P-channel MOS transistors. Then, in FIGS. 14A and 14B, thermal oxidization is used to form a second oxide film (second gate oxide film) 48 having a desired thickness (about 7 nm) on this area.

In this case, when the third oxide film 27 is etched, the device separation film 26 is also etched again; but since the oxide film 27 is about 20 nm thick, compared with the conventional case wherein the thick gate oxide film 103 (e.g., 103 nm) is removed by etching, there is no deterioration of the device separation. That is, the total thickness of the device separation film 26 that is removed is only about 20 nm, both in the high-voltage area and the normal-voltage area, and is satisfactorily smaller than the original 450 nm thickness of the element device film 26, so that unlike the conventional art, there is no deterioration of the element separation function in the normal-voltage area.

Figure 14A:
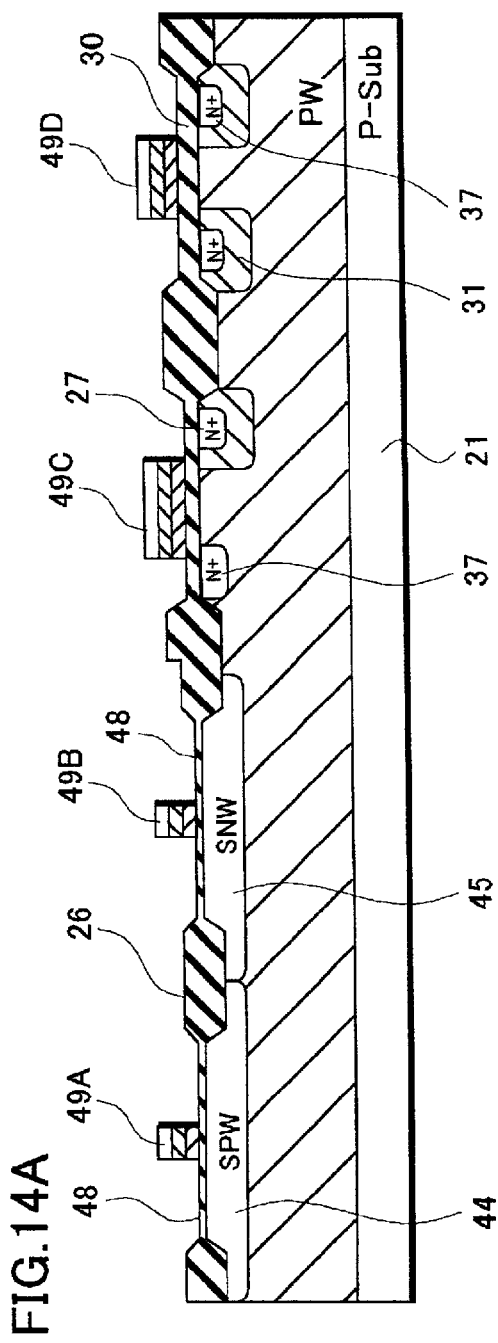
FIGS. 14A and 14B are cross-sectional views of the semiconductor device manufacturing method according to the second embodiment of the invention.
Figure 14B:
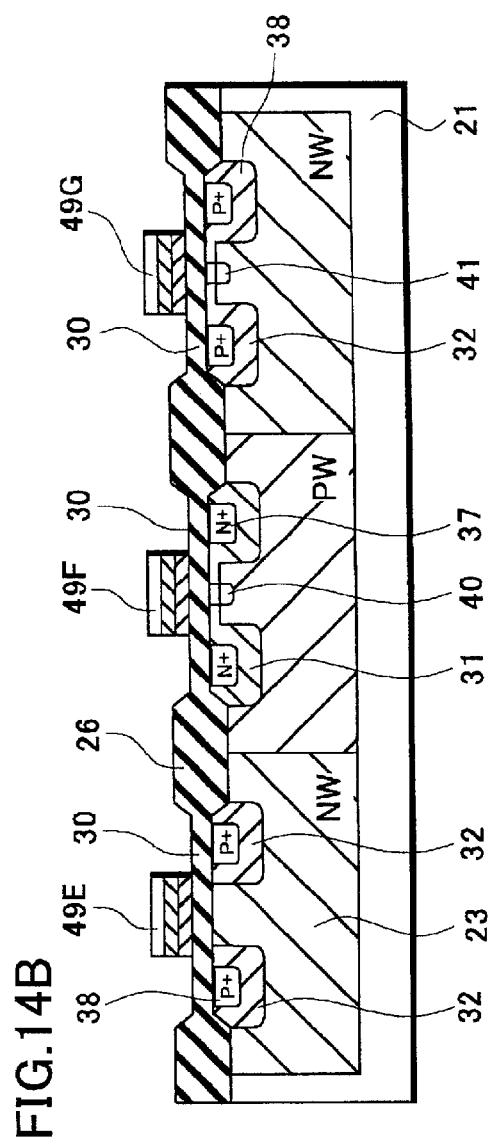

As a result, a first oxide film 30 having a thickness for the high-voltage N-channel and P-channel MOS transistors and the N-channel and P-channel SLEDMOS transistors, a second oxide film 48 having a thickness for the logic N-channel and P-channel MOS transistors, and a third oxide film 27 having a thickness for the N-channel MOS transistors for a level shifter, are formed (see FIGS. 14A and 14B). Then, the first, second and third oxide films 30, 48 and 27 serve as the first, second and third gate oxide films of each transistor.

Following this, as shown in FIGS. 14A and 14B, a polysilicon film about 100 nm thick is formed across all the areas and is rendered conductive, as a thermal diffusion source, by thermal diffusion using $POCl_3$. Then, a tungsten silicide ($WSi_x$) film of about 100 nm and an $SiO_2$ film of about 150 nm are laminated on the polysilicon film, and are patterned using a photoresist film (not shown), so that gate electrodes 49A, 49B, 49C, 49D, 49E, 49F and 49G, which are used for individual MOS transistors, are formed. The $SiO_2$ film serves as a hard mask for the patterning.

Next, as is shown in FIGS. 15A and 15B, source/drain layers 50 and 51 having a low concentration are formed for the normal-voltage N-channel and the P-channel MOS transistors.

Specifically, first, the areas except the low-concentration source/drain layer formation area used for the normal-voltage N-channel MOS transistor is covered with a photoresist film (not shown), and by using this photoresist film as a mask, phosphorus ions, for example, are implanted at acceleration energy of 20 keV and at a dose of $6.2\times10^{13}/cm^2$. As a result, the N-type source/drain layers 50 having a low concentration are obtained. Further, the areas except the low-concentration source/drain formation area used for the normal-voltage P-channel MOS transistor are covered with a photoresist film 52, and by using this photoresist film 52 as a mask, difluoride boron ions, for example, are implanted under a condition at acceleration energy of about 20 keV and at a dose of $2\times10^{13}/cm^2$. As a result, the P-channel source/drain layers 51 having a low concentration are obtained.

Figure 16B:
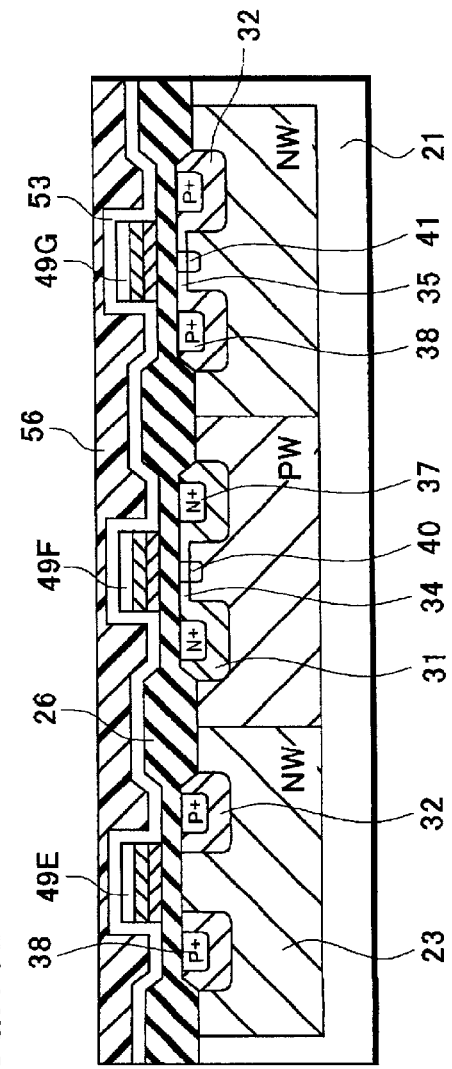
Figure 17A:
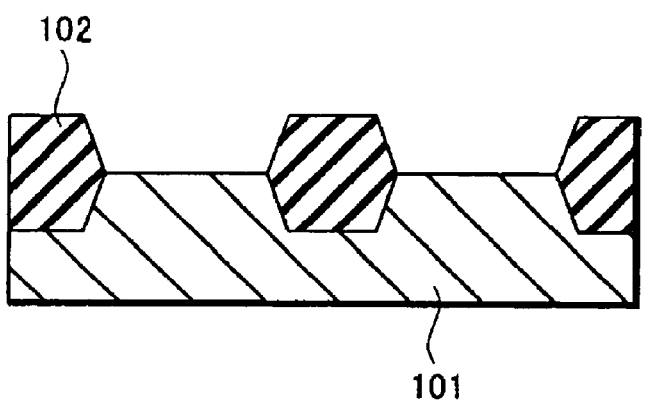
FIGS. 17A to 17C are cross-sectional views of a conventional semiconductor device manufacturing method.
Figure 17B:
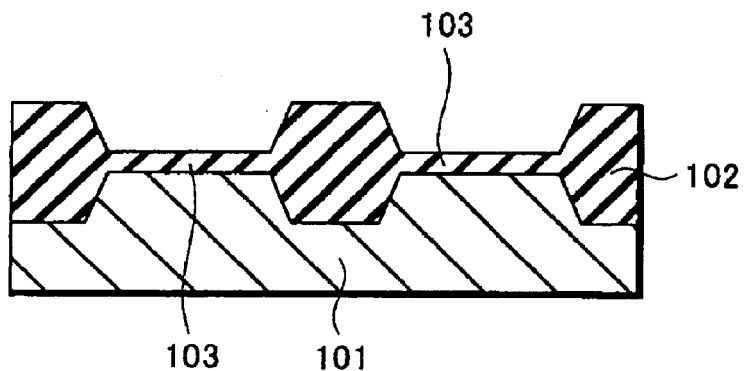
Figure 17C:
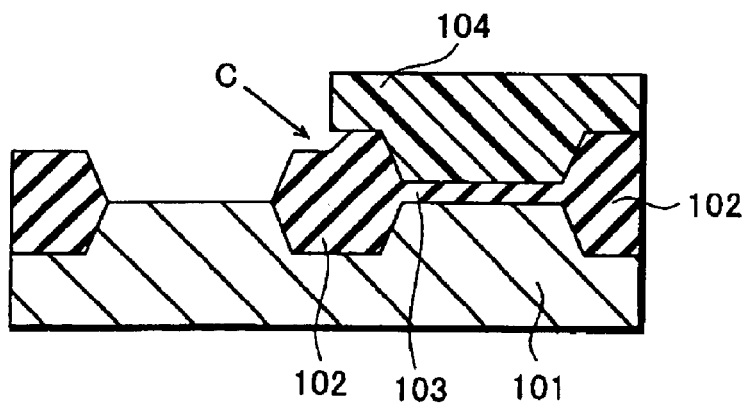
Figure 18A:
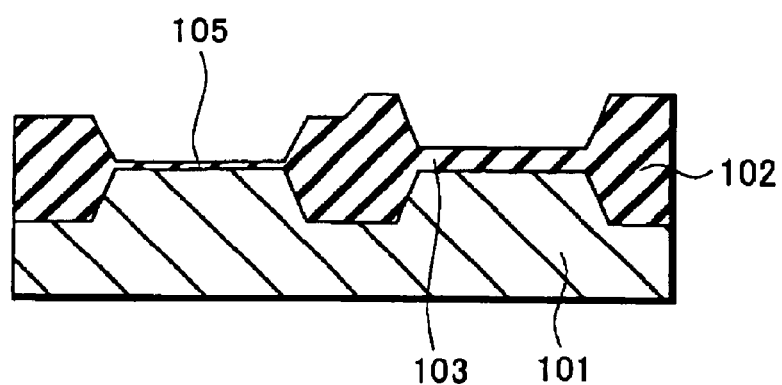
FIGS. 18A and 18B are cross-sectional views of the conventional semiconductor device manufacturing method.
Figure 18B:
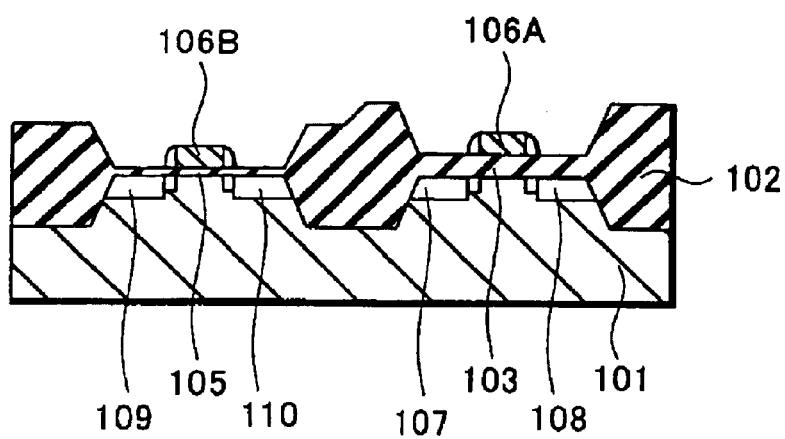

Furthermore, in FIGS. 16A and 16B, by using the LPCVD method, a silicon dioxide film 53 about 250 nm thick is formed across the entire area to cover the gate electrodes 49A, 49B, 49C, 49D, 49E, 49F and 49G, and is anisotropically etched by using, as a mask, a photoresist film (not shown) that has openings in the normal-voltage N-channel and P-channel MOS transistor formation areas. Thus, as is shown in FIG. 16A, a side wall spacer film 53A is formed on both side walls of the gate electrodes 49A and 49B, while the silicon dioxide film 53 remains on the area covered by the photoresist film.

Then, source/drain layers 54 and 55 having a high concentration are formed for the normal-voltage N-channel and P-channel MOS transistors, by using as masks the gate electrode 49A and the side wall spacer film 53A, and the gate electrode 49B and the side wall spacer film 53A, respectively.

Specifically, areas except the high concentration source/drain layer formation area used for the normal-voltage N-channel MOS transistor are covered with a photoresist film (not shown), and by using this film as a mask, arsenic ions, for example, are implanted under a condition at acceleration energy of about 100 keV and at a dose of $5 \times 10^{15}/cm^2$, and as a result, the N$^+$ source/drain layers 54 having a high concentration are obtained. Furthermore, areas except the high concentration source/drain layer formation area used for the normal-voltage P-channel MOS transistor are covered with a photoresist film 56, and by using this film as a mask, difluoride boron ions, for example, are implanted under a condition at acceleration energy of about 40 keV and at a dose of $2 \times 10^{15}/cm^2$, and as a result, the P$^+$ source/drain layers 55 having a high concentration are obtained.

Although not shown, an interlayer insulating film about 600 nm thick, which is made of a silicon dioxide film and a BPSG film, is formed across the entire area, and a metal wire layer is formed to contact the source/drain layers 37, 38, 54 and 55 having a high concentration. Thus, the normal-voltage N-channel and P-channel MOS transistors, the N-channel MOS transistor for a level shifter, the high-voltage N-channel and P-channel MOS transistors, and the high-voltage and low-on resistant N-channel and P-channel SLEDMOS transistors are completed, all of which together constitute the EL display driver.

As is described above, according to the second embodiment, to constitute the EL display driver using various MOS transistors, gate oxide films having different thicknesses must be formed that correspond to the transistors (in this embodiment, transistors having different thicknesses, i.e., 7 nm, 20 nm and 80 nm). Compared with the conventional process for forming gate oxide films having different thicknesses, the deterioration of the device separation due to the reduction in the thickness of the device separation film can be suppressed. Furthermore, when this invention is applied to a process for forming a semiconductor device wherein various transistors whose gate oxide thicknesses differ even more are mounted, greater effects can be obtained.

In addition, for the SLEDMOS transistors, since the P-type body layer or the N-type body layer is formed only under the gate electrode, the junction capacity can be reduced compared with a so-called DMOS transistor wherein a source layer having a high concentration is enclosed by the P-type body layer or the N-type body layer.

Further, in the structure of this invention, since both the P-type body layer and the N-type body layer are formed by ion implantation, this method can be used to form the microstructure, rather than the diffusion method that is used for the conventional DMOS process employed to form this layer.

According to the manufacturing method of this invention, since a high thermal process for forming a body layer, such as the conventional DMOS process, is not required after the gate electrode is formed, this manufacturing process suits to combine high voltage devices with shrank low voltage devices on one chip.

Further, according to the conventional method for a DMOS transistor for forming a channel by the thermal diffusion of impurity ions, the length of the channel is uniformly determined. However, as is described above, according to the manufacturing method for the SLEDMOS transistor of the invention, either the P-type body layer or the N-type body layer is formed by ion implantation, so that various setups are available, and the flexibility in the design of the channel length is increased.

It is preferable that the ion implantation method be used to form the body area; however, the other steps can be changed as needed, such as diffusion from a gas phase or a solid phase.

Since the high thermal process for forming a body layer, such as the conventional DMOS process, is not required after the gate electrode has bee formed, the manufacturing process can be applied with the microstructure process, and drivers for various display devices (e.g., an EL display driver) and a controller can be formed on one chip.

Further, according to the manufacturing method of the invention, the high-voltage MOS transistor and the high-voltage SLEDMOS transistor, for which an on resistivity lowering process is performed, can be separately fabricated, depending on whether the ion implantation step should be performed to form the body layers of the individual conductive types that constitute channels. Operability, therefore, is superior.

According to the invention, since the conventional step for etching and removing the thick gate oxide film is not required, the deterioration of the device separation function due to the reduction in the thickness of the device separation film can be suppressed.

In addition, since the silicon substrate is seldom exposed to etchant with the photoresist film, contamination into the silicon substrate is prevented and the quality of the gate oxide film formed on the silicon substrate is increased.

What is claimed is:

1. A semiconductor device manufacturing method comprising:
   providing a substrate having a first formation area and a second formation area;
   forming an oxide film on the first and the second formation areas;
   forming an oxidation resistance film on the oxide film;
   masking the second formation area by disposing a photoresist on the oxidation resistance film above the second formation area;
   removing the oxidation resistant film above the first formation area;
   removing the photoresist above the second formation area;
   removing the oxide film above the first formation area while using the oxidation resistant film above the second formation area as a mask;
   forming a first oxide film on the first formation area;
   removing the oxide film on the second formation area and the oxidation resistance film above the second formation area without forming a photoresist; and
   forming a second oxide film on the second formation area, wherein the first oxide film has thickness different from the second oxide film.

2. A semiconductor device manufacturing method according to claim 1,
   wherein the first oxide film serves as a gate oxide film of a first transistor, and the second oxide film serves as a gate oxide films of a second transistor.

3. A semiconductor device manufacturing method according to claim 2,
   wherein the first transistor is formed on the first oxide film, and the second transistor is formed on the second oxide film, wherein the first oxide film is formed by performing thermal oxidization by using the oxidation resistant film as a mask, wherein the second oxide film is formed by performing thermal oxidization.

4. A semiconductor device manufacturing method comprising:

forming a device separation film on the semiconductor;

forming an oxide film on a first transistor formation area and a second transistor formation area by performing thermal oxidization using the device separation film as a mask;

forming an oxidation resistant film across the entire surface of the semiconductor;

removing the oxidation resistant film on the first transistor formation area by using a photoresist film as a mask;

removing the photoresist film;

removing the oxide film on the first transistor formation area by using the oxidation resistant film on the second transistor formation area as a mask;

forming a first oxide film by performing thermal oxidization by using the oxidation resistant film formed on the second transistor formation area as a mask;

removing the oxidation resistant film and the oxide film on the second transistor formation area without forming a photoresist;

forming a second oxide film on the second transistor formation area by performing thermal oxidization, wherein the first oxide film has thickness different from the second oxide film.

5. A semiconductor device manufacturing method according to claim 4, wherein a high-voltage MOS transistor is formed on the first gate oxide film thicker than the second gate oxide film, wherein a normal-voltage MOS transistor is formed on the second gate oxide film.

6. A semiconductor device manufacturing method according to claim 4, wherein the surface of the semiconductor is not exposed when the photoresist film is used as a mask.

7. A semiconductor device manufacturing method according to claim 4, wherein forming a first transistor includes:

forming a source/drain layer of a first conductive type having a low concentration by implanting ions of a first conductive impurity into the semiconductor of a second conductive type;

forming a source/drain layer of the first conductive type having a high concentration in the source/drain layer having the low concentration by implanting ions of the first conductive impurity into the semiconductor;

forming a semiconductor layer of the second conductive type that serves as a channel and is located between the source/drain layers of the first conductive type; and forming a first gate electrode on the semiconductor through the first gate oxide film.

8. A semiconductor device manufacturing method according to claim 7, wherein the source/drain layer having the low concentration is formed to contact at least the semiconductor layer that is formed below the first gate electrode.

9. A semiconductor device manufacturing method according to claim 7, wherein the source/drain layer having the low concentration extends in a surface layer of the semiconductor to contact at least the semiconductor layer that is formed below the first gate electrode.

10. A semiconductor device manufacturing method according to claim 4 further comprising forming a first transistor after forming the first gate oxide film, including:

forming an opposite conductive source/drain layer having a low concentration by implanting ions of an opposite conductive impurity into the semiconductor of one conductive type;

forming an opposite conductive source/drain layer having a high concentration in the opposite conductive source/drain layer having the low concentration by implanting ions of the opposite conductive impurity into the semiconductor; and forming a first gate electrode on the semiconductor through the first gate oxide film.

11. A semiconductor device manufacturing method comprising:

forming a device separation film on the semiconductor;

forming an oxide film on a first transistor formation area and a second transistor formation area by performing thermal oxidization using the device separation film as a mask;

forming an oxidation resistant film across the entire surface of the semiconductor;

removing the oxidation resistant film on the first transistor formation area by using a photoresist film as a mask;

removing the photoresist film;

removing the oxide film on the first transistor formation area by using the oxidation resistant film on the second transistor formation area as a mask;

forming a first oxide film by performing thermal oxidization by using the oxidation resistant film formed on the second transistor formation area as a mask;

removing the oxidation resistant film and the oxide film on the second transistor formation area;

forming a second oxide film on the second transistor formation area by performing thermal oxidization, wherein the first oxide film has thickness different from the second oxide film; and further comprising:

forming the first transistor after forming the first gate oxide film, which includes forming first impurity layers having a low concentration by implanting ions of a first conductive impurity into two portions of the semiconductor of a second conductive type;

forming a second impurity layer having a low concentration by implanting ions of the first conductive impurity to connect the first impurity layers;

forming a third impurity layer having a high concentration by implanting ions of the first conductive impurity in the first impurity layer;

forming a fourth impurity layer by implanting ions of a second conductive impurity to divide the second impurity layer; and forming a first gate electrode on the semiconductor including the fourth impurity layer through the first gate oxide film.

12. A semiconductor manufacturing method according to claim 11, wherein the second impurity layer is thinner than the first impurity layer.

* * * * *